United States Patent
Du

(10) Patent No.: US 10,594,957 B2
(45) Date of Patent: Mar. 17, 2020

(54) IMAGE ACQUISITION CONTROL METHODS AND APPARATUSES, AND IMAGE ACQUISITION DEVICES

(71) Applicant: Beijing Zhigu Rui Tuo Tech Co., Ltd, Beijing (CN)

(72) Inventor: Lin Du, Beijing (CN)

(73) Assignee: BEIJING ZHIGU RUI TUO TECH CO., LTD, Beijing (CN)

( * ) Notice: Subject to any disclaimer, the term of this patent is extended or adjusted under 35 U.S.C. 154(b) by 333 days.

(21) Appl. No.: 15/501,611

(22) PCT Filed: Jul. 24, 2015

(86) PCT No.: PCT/CN2015/084992
§ 371 (c)(1),
(2) Date: Feb. 3, 2017

(87) PCT Pub. No.: WO2016/019809
PCT Pub. Date: Feb. 11, 2016

(65) Prior Publication Data
US 2017/0229523 A1  Aug. 10, 2017

(30) Foreign Application Priority Data
Aug. 6, 2014 (CN) .......................... 2014 1 0384906

(51) Int. Cl.
*H04N 5/341* (2011.01)
*H04N 5/232* (2006.01)
(Continued)

(52) U.S. Cl.
CPC ........... *H04N 5/341* (2013.01); *H01L 27/326* (2013.01); *H01L 27/3218* (2013.01);
(Continued)

(58) Field of Classification Search
CPC . H01L 27/326; H01L 27/3211; G09G 3/3233; H04N 5/232; H04N 5/238; H04N 5/341; H04N 5/3696
See application file for complete search history.

(56) References Cited

U.S. PATENT DOCUMENTS

| 7,742,090 B2 | 6/2010 | Street et al. |
| 8,654,152 B2 | 2/2014 | McEldowney et al. |

(Continued)

FOREIGN PATENT DOCUMENTS

| CN | 1792089 A | 6/2006 |
| CN | 102201422 A | 9/2011 |

(Continued)

OTHER PUBLICATIONS

International Search Report for PCT Application No. PCT/CN2015/084992, dated Sep. 17, 2015, 3 pages.

(Continued)

*Primary Examiner* — Nelson D. Hernández Hernández
(74) *Attorney, Agent, or Firm* — Amin, Turocy & Watson, LLP

(57) ABSTRACT

Various image acquisition control methods and apparatuses, and various image acquisition devices are disclosed. One of the image acquisition control methods comprises: acquiring target pixel density distribution information of an image to be acquired; adjusting pixel density distribution of an image sensor according to the target pixel density distribution information; and acquiring the image to be acquired according to the adjusted image sensor. Technical solutions provided can fully utilize integral pixels of an image sensor to achieve differentiated resolution of different displayed regions of an acquired image, improve efficiency of image acquisition, and/or better satisfy diversified application demands of a user.

24 Claims, 7 Drawing Sheets

(51) Int. Cl.
H04N 5/369 (2011.01)
H01L 27/32 (2006.01)
H04N 5/238 (2006.01)

(52) U.S. Cl.
CPC ............ *H04N 5/232* (2013.01); *H04N 5/238* (2013.01); *H04N 5/3696* (2013.01); *G09G 2300/0439* (2013.01)

(56) References Cited

U.S. PATENT DOCUMENTS

| | | | |
|---|---|---|---|
| 9,402,034 | B2 | 7/2016 | Price et al. |
| 2004/0095492 | A1* | 5/2004 | Baxter ................ H04N 3/155 348/302 |
| 2006/0256227 | A1 | 11/2006 | Gotzig |
| 2008/0151089 | A1 | 6/2008 | Street et al. |
| 2011/0310125 | A1* | 12/2011 | McEldowney ......... G06F 3/017 345/660 |
| 2013/0027581 | A1 | 1/2013 | Price et al. |

FOREIGN PATENT DOCUMENTS

| | | |
|---|---|---|
| CN | 102332090 A | 1/2012 |
| CN | 104159025 A | 11/2014 |
| JP | 2006129411 A | 5/2006 |
| JP | 2006253876 A | 9/2006 |
| WO | 2004102952 A1 | 11/2004 |

OTHER PUBLICATIONS

Choi, et al. "A Spatial-Temporal Multi-Resolution CMOS Image Sensor with Adaptive Frame Rates for Moving Objects in the Region-of-Interest" 2007 IEEE International Solid-State Circuits Conference / Session 28 / Image Sensors / 28.2, Feb. 14, 2007, published online at [http://www.ece.umn.edu/groups/iml/publications/2007/ISSCC_Jchoi.pdf], retrieved on Jan. 24, 2017, 3 pages.

"Living Image® Software User's Manual" Caliper LifeSciences, Version 4.2, published online at [http://www2.udel.edu/ctcr/sites/udel.edu.ctcr/files/Living_Image_4-2_User_Guide.pdf], © 2002-2011 Caliper Corporation, retrieved on Jan. 24, 2017, 344 pages.

Ng, et al. "Flexible image sensor array with bulk heterojunction organic photodiode", Applied Physics Letters, 92, 213303 (2008), published online May 28, 2008, retrieved on Jan. 24, 2017, 5 pages.

Ko et al. "A hemispherical electronic eye camera based on compressible silicon optoelectronics." Nature, vol. 454, Aug. 7, 2008, retrieved on Feb. 1, 2017, 6 pages.

Bar-Cohen. "Electroactive polymers for refreshable Braille displays". SPIE. 10.1117/2.1200909.1738. Sep. 11, 2009. Retrieved on Jan. 24, 2017, 3 pages.

Yu, et al. "Directed bending of a polymer film by light", Nature, vol. 425, Sep. 11, 2003, retrieved on Feb. 1, 2017, 1 page.

Chinese Office Action dated Sep. 4, 2017 for Chinese Application No. 201410384906.8, 14 pages (with translation).

\* cited by examiner

IMAGE ACQUISITION CONTROL METHODS AND APPARATUSES, AND IMAGE ACQUISITION DEVICES

RELATED APPLICATION

The present application is a U.S. National Stage filing under 35 U.S.C. § 371 of international patent cooperation treaty (PCT) application No. PCT/CN2015/084992, filed Jul. 24, 2015, and entitled "IMAGE ACQUISITION CONTROL METHODS AND APPARATUSES, AND IMAGE ACQUISITION DEVICES", which claims the benefit of priority to Chinese Patent Application No. 201410384906.8, filed on Aug. 6, 2014, which applications are hereby incorporated into the present application by reference herein in their respective entireties.

TECHNICAL FIELD

The present application relates to the field of image acquisition technologies, and in particular, to various image acquisition control methods and apparatuses, and various image acquisition devices.

BACKGROUND

With continuous development of image acquisition technologies, new devices that support image acquisition are developed continuously, and people's requirements for image acquisition quality also become higher.

To obtain clearer images, an image sensor with a higher pixel density may generally be adopted to acquire an image, so as to improve overall resolution of the acquired image. However, the size of an image acquired by adopting this solution may be increased accordingly, and therefore, the resource load of image storage and/or transmission bandwidth is accordingly increased.

SUMMARY

The following briefly describes the present application, so as to provide a basic understanding of some aspects of the present application. It should be understood that, the brief description is not an exhaustive brief description of the present application. The description is neither intended to determine key or important parts of the present application, nor intended to limit the scope of the present application. An objective thereof is merely to give some concepts in a simplified manner as a preface for more detailed description hereinafter.

The present application provides various image acquisition control methods and apparatuses, and various image acquisition devices.

In one aspect, an example embodiment of the present application provides an image acquisition control method, comprising:

acquiring target pixel density distribution information of an image to be acquired;

adjusting pixel density distribution of an image sensor according to the target pixel density distribution information; and acquiring the image to be acquired according to the adjusted image sensor.

In another aspect, an example embodiment of the present application further provides an image acquisition control apparatus, comprising:

a target pixel density distribution information acquisition module, configured to acquire target pixel density distribution information of an image to be acquired;

a pixel density distribution adjustment module, configured to adjust pixel density distribution of an image sensor according to the target pixel density distribution information; and an image acquisition module, configured to acquire the image to be acquired according to the adjusted image sensor.

In still another aspect, an example embodiment of the present application provides an image acquisition device, comprising an image sensor and an image acquisition control apparatus as described above, the image acquisition control apparatus being connected to the image sensor.

According to the technical solutions provided by example embodiments of the present application, target pixel distribution information of an image to be acquired is acquired by using an image acquisition control apparatus; pixel density distribution of an image sensor is then adjusted according to the acquired target pixel distribution information of the image to be acquired; and the image to be acquired is acquired according to the adjusted image sensor, to cause integral pixels of the image sensor to be fully utilized during a process of image acquisition, and achieve differentiated resolution of different displayed regions of the acquired image, thereby facilitating improvement of image acquisition efficiency without increasing the size of the image, and/or better satisfying diversified application demands of a user.

The following describes in detail alternative embodiments of the present application with reference to accompanying drawings, to make these and other advantages of the present application more clear.

BRIEF DESCRIPTION OF THE DRAWINGS

The present application can be understood better with reference to the following description in combination with accompanying drawings, wherein a same or similar accompanying drawing mark is used in all the accompanying drawings to represent a same or similar component. The accompanying drawings together with the following detailed description are comprised in the specification and constitute a part of the specification, and are used to further illustrate alternative embodiments of the present application and explain the principle and advantages of the present application. In the accompanying drawings.

Figure 1A:
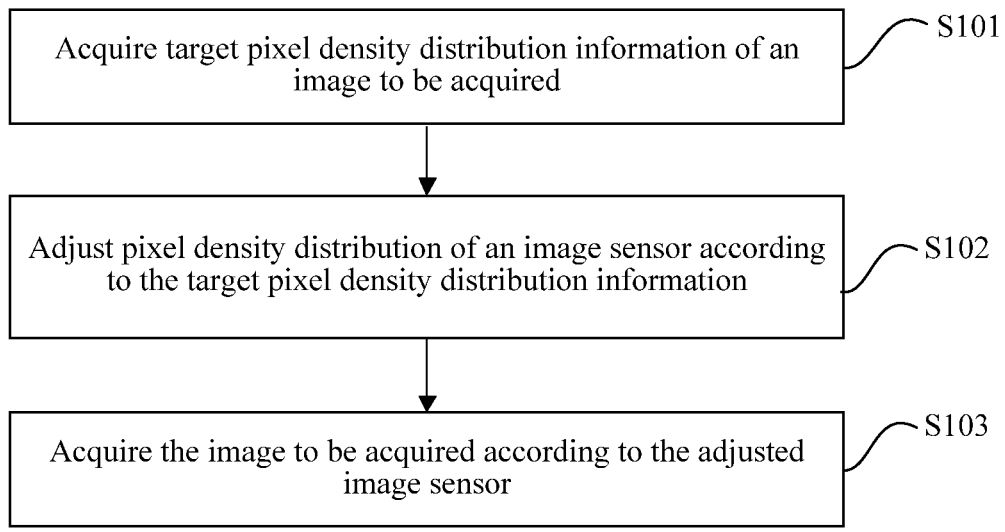
FIG. 1a is a flowchart of an image acquisition control method according to an example embodiment of the present application.

A person skilled in the art should understand that, elements in the accompanying drawings are merely shown for simplicity and clarity, and are not necessarily drawn to scale. For example, in the accompanying drawings, the size of an element may be enlarged relative to another element, so as to facilitate enhancing an understanding of the embodiments of the present application.

DETAILED DESCRIPTION

The following will describe in details illustrative embodiments of the present application with reference to accompanying drawings. For the purpose of clear and brief description, the specification does not describe all features of practical implementation manners. However, it should be understood that, many decisions specific to the implementation manners can be made during development of any one of the practical embodiments, so as to achieve a specific objective of a developer, for example, conformance to restrictive conditions related to a system and service, wherein the restrictive conditions may vary with different implementation manners. In addition, it should also be understood that, although development work may be very complex and time-consuming, for a person skilled in the art that benefits from the content of the present disclosure, the development work is only a routine task.

Another point that should be noted is, to avoid the present application from being not clearly understood due to unnecessary details, the accompanying drawings and specification merely describe apparatus structures and/or processing steps closely related to the solutions of the present application, but omit the representation and description of parts and processing that have little relation with the present application, and have been known by a person of ordinary skill in the art.

The following further describes in detail example embodiments of the present application with reference to the accompanying drawings (a same label represents a same element in several accompanying drawings) and embodiments. The following embodiments are used to describe the present application, but are not intended to limit the scope of the present application.

A person skilled in the art may understand that, terms such as "first" and "second" in the present application are merely used to distinguish different steps, devices, modules, or the like, which neither represent any specific technical meaning, nor indicate necessary logic sequence among them.

It is noted that when implementing the embodiments of the present application that, generally, when image acquisition is performed, pixels of an image sensor are evenly distributed, and pixel densities of regions of an image acquired on the basis of the image sensor are identical. However, in some scenarios, the regions in a frame of an image generally have different meanings and/or importance for a user, that is, a user has a different degree of interest in different regions of an acquired image. For example, in a scenario of taking a photo of a person, a user is more interested in the person's face in an image than scenery in the image; and for another example, in a scenario of video monitoring over a parking area, a user is more interested in regions of a video image such as plate number and a driver's face than roadside scenery in the video image; and so forth. If the image quality of a region of interest needs to be improved, an image sensor with a higher pixel density may be adopted to acquire an image, so as to improve overall resolution of the acquired image. However, the size of an image acquired by adopting this solution may be increased accordingly, and therefore, the resource load of image storage and/or transmission bandwidth is accordingly increased. To relieve the above resource load, the acquired image may be processed by means of compressing. For example, an image of a region of no interest in the image is processed with down-sampling, but in this solution, the image size is reduced by lowering resolution of the region of no interest in the image, and the image resolution of a region of interest cannot be improved.

Therefore, an embodiment of the present application provides an image acquisition control method, which can fully utilize integral pixels of an image sensor to achieve differentiated resolution of different displayed regions of an acquired image, thereby better satisfying diversified application demands of a user. The following describes the technical solutions with reference to the accompanying drawings.

FIG. 1a is a flowchart of an image acquisition control method provided by an embodiment of the present application. The image acquisition control method provided by this embodiment of the present application may be executed by an image acquisition control apparatus, wherein the image acquisition control apparatus can perform control over acquisition of a static or dynamic image by using the image acquisition control method during an application procedure, including but not limited to: photo taking, camera shooting, photographing, and video monitoring. There is no limit to the manners in which the image acquisition control apparatus is embodied. For example, the image acquisition control apparatus may be an independent component, the component cooperating with an image acquisition device comprising an image sensor in communications; or the image acquisition control apparatus may be integrated as a functional module into an image acquisition device comprising an image sensor, which is not restricted in this embodiment of the present application.

Specifically, as shown in FIG. 1a, an image acquisition control method provided by an embodiment of the present application comprises:

S101: Acquire target pixel density distribution information of an image to be acquired.

The target pixel density distribution information of the image to be acquired is generally used for representing a relative expectation of a user or device for image resolution of different regions of the image to be acquired. For example, for a region of the image to be acquired with a high image resolution expectation, a target pixel density corresponding to the region is large, so as to achieve image acquisition of the region in a super-resolution manner; and for another region of the image to be acquired, requirements for image quality and resolution may be properly reduced, and image acquisition of the another region may be performed in a down-sampling manner. In this way, target pixel densities of different regions of the image to be acquired are caused to vary.

S102: Adjust pixel density distribution of an image sensor according to the target pixel density distribution information.

The image sensor is an image sensor with an adjustable pixel density, for example, a flexible image sensor. The flexible image sensor comprises a flexible substrate, and a plurality of image sensor pixels formed on the flexible substrate, wherein the flexible substrate may change such as expand, shrink, or bend when a certain condition is met, so as to adjust pixel density distribution thereof. In this embodiment of the present application, in combination with the feature of the image sensor having an adjustable pixel density, pixel density distribution of the image sensor is adjusted according to the target pixel density distribution information, to cause the adjusted pixel density distribution of the image sensor to correspond to the target pixel density distribution information, or to cause the adjusted pixel density distribution of the image sensor to approach the target pixel density distribution information as far as possible.

S103: Acquire the image to be acquired according to the adjusted image sensor.

During a process of image acquisition, all pixels of the image sensor are involved in the image acquisition. Because pixel density distribution of the image sensor has been adjusted according to the target pixel density distribution information, when the image to be acquired is acquired according to the adjusted image sensor, resolution of different regions of the acquired image shows differentiated distribution corresponding to the target pixel density distribution information. In this solution, integral pixels of the image sensor are fully utilized to make corresponding adjustment on existing pixel density distribution of the image sensor according to the target pixel density distribution information, to achieve an effect of performing image acquisition on different regions according to different pixel densities, and cause resolution of different regions of the acquired image to vary, thereby facilitating improvement of image acquisition efficiency without increasing the size of the image, and better satisfying diversified application demands of a user.

In the above technical solution, there is no limit on manners of acquiring the target pixel density distribution information. In an alternative example embodiment, a first region of the image to be acquired is acquired, and the target pixel density distribution information is determined according to the first region, wherein a target pixel density corresponding to the first region is different from a target pixel density corresponding to a second region in the target pixel density distribution information, wherein the second region comprises at least a part of a region other than the first region in the image to be acquired.

The first region may comprise at least a part of a region in the image to be acquired, for which resolution needs to be adjusted. A description is made by using resolution of an image acquired by the image sensor as comparison resolution under a circumstance of pixels being evenly distributed. For example, the first region comprises at least a part of a region in the image to be acquired, for which resolution needs to be improved relative to the comparison resolution. Under this circumstance, a target pixel density corresponding to the first region is greater than a target pixel density corresponding to the second region in the target pixel density distribution information. For another example, the first region comprises at least a part of a region in the image to be acquired, for which resolution needs to be reduced relative to the comparison resolution. Under this circumstance, a target pixel density corresponding to the first region is less than a target pixel density corresponding to the second region in the target pixel density distribution information. The above solution may be implemented in very flexible manners, which can better satisfy diversified application demands of a user.

The manners of acquiring a first region of the image to be acquired may be determined much flexibly according to actual demands.

In an alternative example embodiment, a first region of the image to be acquired is determined according to information of a region of interest (ROI for short), that is, region-of-interest information is acquired; and the first region of the image to be acquired is determined according to the region-of-interest information. The region of interest may comprise but is not limited to one or more of the following: at least one region of the image to be acquired that is selected by a user (namely, a user's selection region of the image to be acquired), at least one region of the image to be acquired that is gazed by a user (namely, a user's gaze region of the image to be acquired), and a region of interest of the image to be acquired that is automatically detected by an image acquisition device. In this solution, a first region of the image to be acquired is determined according to the region of interest, wherein the determined first region may be a region that corresponds to the region of interest, or a region of the image to be acquired that corresponds to a region of no interest, to cause determining of the first region to be more consistent with a user's actual demands, and better satisfy personalized application demands of a user.

In another alternative example embodiment, a first region of the image to be acquired is determined according to a result of image analysis, that is, image analysis is performed on the image to be acquired; and the first region of the image to be acquired is determined according to a result of the image analysis. For example, when face recognition is performed on an image to be acquired, a face region is determined as the first region of the image to be acquired according to a recognition result. For another example, when moving object recognition is performed on an image to be acquired, a corresponding region of a moving object is determined as the first region of the image to be acquired according to a recognition result. In this solution, the first region can be determined according to a result of image analysis on the image to be acquired, to cause determining of the first region to be more intelligent and improve efficiency and general applicability of the first region determining.

Further, the first region may comprise one or more first sub-regions. The first sub-region comprises at least a part of a region in the image to be acquired, for which resolution needs to be improved relative to the comparison resolution. Under a circumstance that the first region comprises a plurality of the first sub-regions, the plurality of the first sub-regions may be continuously distributed in the image to be acquired, for example, the plurality of the first sub-regions is all connected on the boundary; or the plurality of the first sub-regions may be discretely distributed in the image to be acquired, for example, the plurality of the first sub-regions is all not connected on the boundary, or at least one of the plurality of the first sub-regions is not connected to another one of the first sub-regions on the boundary. The resolution of the first sub-region of the image to be acquired may be adjusted, namely, improved or reduced relative to the comparison resolution, which is not restricted in this embodiment of the present application. This solution can improve flexibility of determining the first region of the image to be acquired for which image resolution needs to be adjusted, and better satisfy diversified application demands of a user.

In addition, under a circumstance that the first region comprises a plurality of the first sub-regions, the target pixel density of each first sub-region may be determined according to actual demands.

In an alternative example embodiment, target pixel densities respectively corresponding to the first sub-regions are identical in the target pixel density distribution information. For example, the first region comprises a plurality of the first sub-regions (such as a plurality of human faces) discretely distributed in an image to be acquired (such as a video monitoring image comprising a plurality of persons), and target pixel densities respectively corresponding to the plurality of the first sub-regions are identical. In this solution, resolution of a plurality of first sub-regions in the image to be acquired may be adjusted to a same degree (for example, pixel densities corresponding to all human faces are improved or reduced to a same target pixel density), to cause resolution of these first sub-regions to be identical or as close as possible.

In another alternative example embodiment, a target pixel density corresponding to at least one of the first sub-regions is different from a target pixel density corresponding to any one of the other first sub-regions in the target pixel density distribution information. For example, the first region comprises a plurality of three first sub-regions A, B and C that are continuously distributed in an image to be acquired, target pixel densities corresponding to the first sub-regions A, B and C are respectively A', B', and C', and the target pixel densities A', B', and C' are increased progressively. In this solution, the resolution of a plurality of sub-regions in the image to be acquired can be adjusted to a different degree (such as gradually become clearer, gradually become fuzzier, or partially become clearer and partially become fuzzier), to cause the resolution of these first sub-regions to show a certain degree of differentiation.

In this embodiment of the present application, after target pixel density distribution information of an image to be acquired is acquired, pixel density distribution of an image sensor can be adjusted according to the target pixel density distribution information. Manners of adjusting pixel density distribution of the image sensor can be selected according to actual demands, which is not restricted in this embodiment of the present application. In an alternative example embodiment, deformation control information of a controllably-deformable material part is determined according to the target pixel density distribution information; and the controllably-deformable material part is controlled to deform according to the deformation control information, so as to accordingly adjust pixel density distribution of the image sensor though deformation of the controllably-deformable material part. In this solution, pixel distribution of the image sensor is adjusted by controlling deformation of a controllably-deformable material part, which is simple and easily implemented.

For the controllably-deformable material part, when an external influencing factor (such as an external field) acting thereon is changed, the controllably-deformable material part can be caused to deform; and when the external field acting thereon is removed or changed, the deformation of the controllably-deformable material part can be recovered.

Figure 1B:
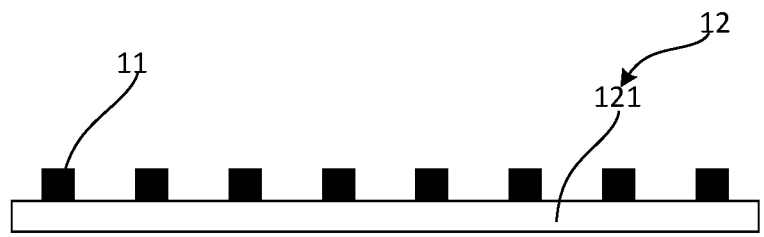
FIG. 1b is a schematic structural diagram of a first image sensor with an adjustable pixel density according to an example embodiment of the present application.

FIG. 1b is a schematic structural diagram of an image sensor with an adjustable pixel density provided by an embodiment of the present application. As shown in FIG. 1b, the image sensor with an adjustable pixel density provided by this embodiment of the present application comprises: a plurality of image sensor pixels 11 and a controllably-deformable material part 12, wherein the image sensor performs image acquisition by using image sensor pixels 11, the plurality of image sensor pixels 11 are distributed in an array form, and the controllably-deformable material part 12 is connected to the plurality of image sensor pixels 11 separately; the controllably-deformable material part 12 may deform under the effect of an external field, and density distribution of the plurality of image sensor pixels 11 can be adjusted accordingly through deformation of the controllably-deformable material part 12.

In the technical solution provided by this embodiment of the present application, for the controllably-deformable material part, when an external field influencing factor acting thereon is changed, the controllably-deformable material part can be caused to deform; and when the external field influencing factor is removed or changed, the deformation of the controllably-deformable material part can be recovered. The external field may be selected from a corresponding external control filed acting thereon according to deformation characteristics of the controllably-deformable material part. For example, the external field comprises but is not limited to an external electric field, a magnetic field, an optical field, and the like. The image sensor pixel may comprise but is not limited to at least one photoelectric conversion unit. Each image sensor pixel and a controllably-deformable material part can be closely connected by using (but not limited to) an adhesion manner, so that when the controllably-deformable material part deforms, an interval of the image sensor pixels is accordingly adjusted, so as to adjust density distribution of image sensor pixels, and achieve an effect of differentiated pixel density distribution of different regions of the image sensor according to actual demands.

In practical application, an unevenly distributed external field may be applied on different regions of the controllably-deformable material part, to cause the different regions of the controllably-deformable material part to undergo a different degree of deformation, thereby adjusting integral density distribution of image sensor pixels. Alternatively, the external field may be applied on a non-overlap region of the controllably-deformable material part and a plurality of the image sensor pixels, to cause an overlap region of the controllably-deformable material part and the plurality of the image sensor pixels not to undergo deformation; and density distribution of image sensor pixels is changed through deformation of another part of the controllably-deformable material part. This solution is favorable to preventing damage to the image sensor pixels caused by deformation of the controllably-deformable material part.

In practical application, the controllably-deformable material part may be made by selecting at least one suitable controllably-deformable material as demanded, to cause the controllably-deformable material part to have a feature of deformability and deformation recoverability. Alternatively, the controllably-deformable material part is made from at least one or more of the following controllably-deformable materials: a piezoelectric material, an electroactive polymer, a photodeformable material, and a magneto strictive material.

The piezoelectric material may undergo mechanical deformation under the effect of an electric field. A controllably-deformable material part made by using the piezoelectric material is called a piezoelectric material part below. With this physical property of the piezoelectric material, in this embodiment of the present application, electric field control information required for causing the piezoelectric material part to undergo corresponding mechanical deformation is determined according to (but not limited to) the target pixel density distribution information, and an electric field acting on the piezoelectric material part is controlled according to the electric field control information, to cause the piezoelectric material part to undergo corresponding mechanical deformation, and accordingly adjust pixel density distribution of an image sensor through the mechanical deformation of the piezoelectric material part, thereby achieving a purpose of adjusting pixel density distribution of the image sensor according to the target pixel density distribution information. The piezoelectric material may comprise but is not limited to at least one of the following: a piezoelectric ceramic, and a piezoelectric crystal. This solution can fully utilize a physical property of a piezoelectric material to adjust pixel density distribution of an image sensor.

The electroactive polymers (EAP for short) are a type of polymer materials that may exhibit a change in shape or size under the effect of an electric field. A controllably-deformable material part made by using the electroactive polymer is called an electroactive polymer part below. With this physical property of the electroactive polymers, in this embodiment of the present application, electric field control information required for causing the electroactive polymer part to undergo corresponding deformation is determined according to (but not limited to) the target pixel density distribution information, and an electric field acting on the electroactive polymer layer is controlled according to the electric field control information, to cause the electroactive polymer layer to undergo corresponding deformation, and accordingly adjust pixel density distribution of an image sensor through the deformation of the electroactive polymer layer, thereby achieving a purpose of adjusting pixel density distribution of the image sensor according to the target pixel density distribution information. The electroactive polymer may comprise but is not limited to at least one of the following: an electronic electroactive polymer, and an ionic electroactive polymer, wherein the electronic electroactive polymer comprises at least one of the following: a ferroelectric polymer (such as polyvinylidene fluoride), an electrostrictive graft polymer, and a liquid crystalline elastomer; and the ionic electroactive polymer comprises at least one of the following: an electrorheological fluid, and an ionic polymer-metal composite. This solution can fully utilize a physical property of an electroactive polymer to adjust pixel density distribution of an image sensor.

The photodeformable material is a type of macromolecule material that may exhibit a change in shape or size under the effect of an optical field. A controllably-deformable material part made by using the photodeformable material is called a photodeformable material part below. With this physical property of the photodeformable material, in this embodiment of the present application, optical field control information required for causing a photodeformable material part to undergo corresponding deformation is determined according to (but not limited to) the target pixel density distribution information, and an optical field acting on the photodeformable material part is controlled according to the optical field control information, to cause the photodeformable material part to undergo corresponding deformation. Pixel density distribution of an image sensor is accordingly adjusted through deformation of the photodeformable material part, thereby achieving a purpose of adjusting pixel density distribution of the image sensor according to the target pixel density distribution information. The photodeformable material may comprise but is not limited to at least one of the following: a photostrictive ferroelectric ceramic and a photodeformable polymer, wherein the photostrictive ferroelectric ceramic comprises but is not limited to a lead lanthanum zirconate titanate (PLZT) ceramic, and the photodeformable polymer comprises but is not limited to a photodeformable liquid crystalline elastomer. This solution can fully utilize a physical property of a photodeformable material to adjust pixel density distribution of an image sensor.

The magnetostrictive material is a type of magnetic material that may exhibit a change in magnetic state under the effect of a magnetic field, and then exhibit a change in size. A controllably-deformable material part made by using the magnetostrictive material is called a magnetostrictive material part below. With this physical property of the magnetostrictive material, in this embodiment of the present application, magnetic field control information required for causing a magnetostrictive material part to undergo corresponding deformation is determined according to (but not limited to) the target pixel density distribution information, and a magnetic field acting on the magnetostrictive material part is controlled according to the magnetic field control information, to cause the magnetostrictive material part to undergo corresponding deformation. Pixel density distribution of an image sensor is accordingly adjusted through deformation of the magnetostrictive material part, thereby achieving a purpose of adjusting pixel density distribution of the image sensor according to the target pixel density distribution information. The magnetostrictive material may comprise but is not limited to a rare-earth iron giant magnetostrictive material, such as an alloy material Tbo0.3Dy0.7Fe1.95 with a compound (Tb, Dy)Fe2 as a substrate. This solution can fully utilize a physical property of a magnetostrictive material to adjust pixel density distribution of an image sensor.

In the technical solution provided by this embodiment of the present application, specific structures and connection manners of image sensor pixels and the controllably-deformable material part may be determined according to actual demands, and practical manners are very flexible.

In an alternative example embodiment, as shown in FIG. 1b, the controllably-deformable material part 12 comprises a controllably-deformable material layer 121, wherein a plurality of the image sensor pixels 11 is distributed in an array form and connected to a surface of the controllably-deformable material layer 121. Alternatively, depending on actual technological conditions, a plurality of the image sensor pixels may be directly formed on the controllably-deformable material layer 121, or a plurality of the image sensor pixels and the controllably-deformable material layer 121 may be separately made and closely connected by using (but not limited to) an adhesion manner. This solution features a simple structure and is easily implemented.

Figure 1C:
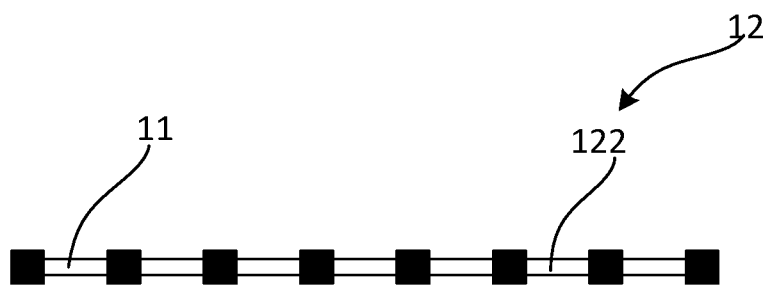
FIG. 1c is a schematic structural diagram of a second image sensor with an adjustable pixel density according to an example embodiment of the present application.

In another alternative example embodiment, as shown in FIG. 1c, the controllably-deformable material part 12 comprises a plurality of controllably-deformable material connection sub-parts 122, wherein the plurality of controllably-deformable material connection sub-parts 122 is distributed in an array form, and correspondingly connected to the plurality of image sensor pixels 11 distributed in an array form, that is, the plurality of image sensor pixels distributed in an array form is connected as a whole by using the plurality of controllably-deformable material connection sub-parts that is distributed in an array form. Alternatively, the plurality of controllably-deformable material connection sub-parts may be formed in an interval area of pixels of an image sensor pixels array according to actual technology, and the plurality of controllably-deformable material connection sub-parts may be connected to corresponding image sensor pixels by using (but not limited to) an abutting or adhesion manner. Density distribution of image sensor pixels can be adjusted by controlling deformation of the plurality of controllably-deformable material connection sub-parts, which features a simple structure and is easily implemented.

Figure 1D:
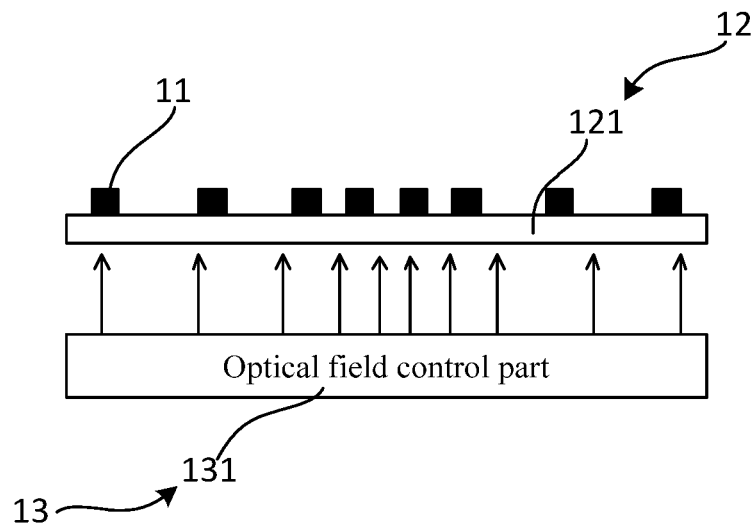
FIG. 1d is a schematic structural diagram of a third image sensor with an adjustable pixel density according to an example embodiment of the present application.
Figure 1E:
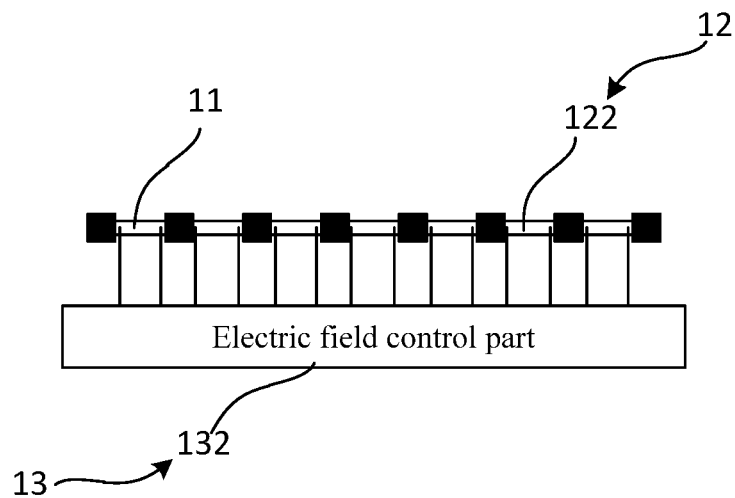
FIG. 1e is a schematic structural diagram of a fourth image sensor with an adjustable pixel density according to an example embodiment of the present application.

Further, as shown in FIG. 1d and FIG. 1e, the image sensor may further comprise a deformation control part 13, wherein the deformation control part 13 is configured to adjust distribution of the external field acting on the controllably-deformable material part 12, so as to control the controllably-deformable material part 12 to undergo corresponding deformation. In this way, when the controllably-deformable material part 12 deforms, an interval of the image sensor pixels 11 may be accordingly adjusted, so as to change density distribution of the image sensor pixels 11, thereby achieving an effect of differentiated pixel density distribution in different regions of the image sensor according to actual demands.

Alternatively, as shown in FIG. 1d, the deformation control part may comprise an optical field control part 131, wherein the optical field control part 131 is configured to adjust distribution of an external optical field acting on the controllably-deformable material part 12, so as to control the controllably-deformable material part 12 to undergo corresponding deformation. Under this circumstance, the controllably-deformable material part 12 may comprise a photodeformable material part at least made from a photodeformable material, for example, the photodeformable material part may comprise a photodeformable material layer at least made from the photodeformable material; or the photodeformable material part may comprise a plurality of photodeformable material connection sub-parts at least made from the photodeformable material. Different regions of the controllably-deformable material part 12 are excited to undergo a different degree of deformation through changing distribution of an optical field acting on the photodeformable material part (in FIG. 1d, different arrow densities are used for representing different distribution intensities of an optical field acting on the controllably-deformable material part 12) by the optical field control part 131, and an interval of the image sensor pixels 11 is accordingly adjusted through deformation of the controllably-deformable material part 12, so as to change density distribution of the image sensor pixels 11, thereby achieving an effect of differentiated pixel density distribution in different regions of the image sensor according to actual demands.

Figure 1F:
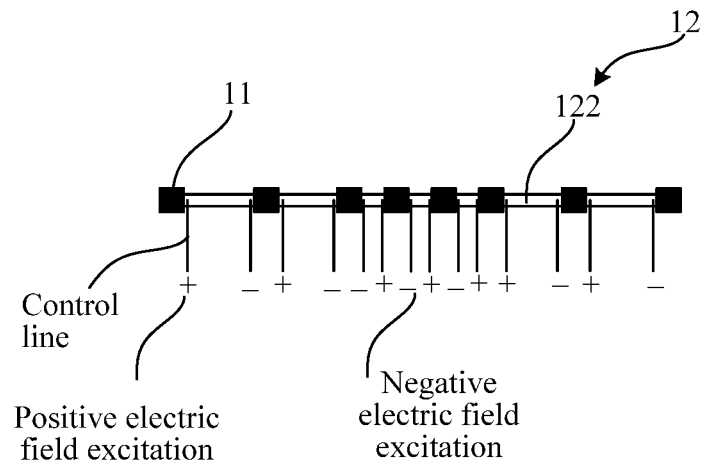
FIG. 1f is a scenario example of pixel density adjustment performed on an image sensor under a circumstance of uneven light field excitation according to an example embodiment of the present application.

Alternatively, as shown in FIG. 1e, the deformation control part may comprise an electric field control part 132, wherein the electric field control part 132 is configured to adjust distribution of an external optical field acting on the controllably-deformable material part, so as to control the controllably-deformable material part to undergo corresponding deformation. Under this circumstance, the controllably-deformable material part 12 may comprise a piezoelectric material part (such as a piezoelectric material layer or a piezoelectric material connection sub-part) at least made from a piezoelectric material, or the controllably-deformable material part 12 may comprise an electroactive polymer part (such as an electroactive polymer layer or an electroactive polymer connection sub-part) at least made from an electroactive polymer. As shown in FIG. 1e, an electric field control part and a controllably-deformable material may be connected by using a control line. Different regions of the controllably-deformable material part 12 are excited to undergo a different degree of deformation through changing distribution of an electric field acting on the controllably-deformable material part 12 by the electric field control part 132. If the electric field acting on the controllably-deformable material part 12 is a zero electric field, the controllably-deformable material part will not deform (or called zero electric field excitation); if distribution intensity of the electric field acting on the controllably-deformable material part 12 is changed (positive electric field excitation "+" and negative electric field excitation "−" as shown in the figure), the intensity of the electric field acting on different regions of the controllably-deformable material part 12 is caused to vary, as shown in FIG. 1f. In this way, different regions of the controllably-deformable material part 12 may undergo a different degree of deformation, and an interval of the image sensor pixels 11 is accordingly adjusted through deformation of the controllably-deformable material part 12, so as to change integral pixels density distribution of the image sensor, thereby achieving an effect of differentiated pixel density distribution in different regions of the image sensor according to actual demands.

In this embodiment of the present application, the controllably-deformable material part and the deformation control part may be directly or indirectly connected. The deformation control part may act as a part of the image sensor or not. The image sensor may be connected to the deformation control part in a manner such as reserving a pin or an interface. The external field acting on the controllably-deformable material part may comprise but is not limited to an electric field, a magnetic field, an optical field, or the like. A hardware and software structure used for generating an electric field, a hardware and software structure used for generating a magnetic field, and a hardware and software structure used for generating an optical field, may be implemented by using corresponding existing technology according to actual demands. The details are not described again in this embodiment of the present application.

Figure 1G:
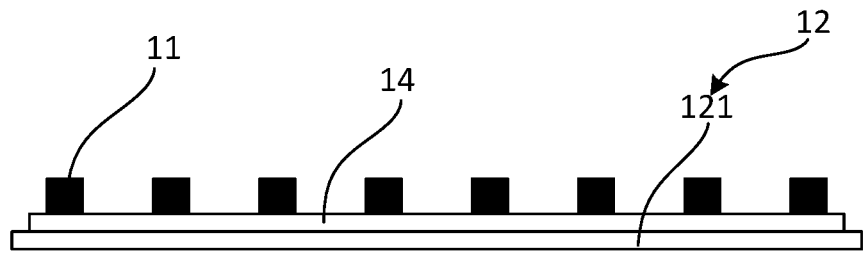
FIG. 1g is a schematic structural diagram of a fifth image sensor with an adjustable pixel density according to an example embodiment of the present application.
Figure 1H:
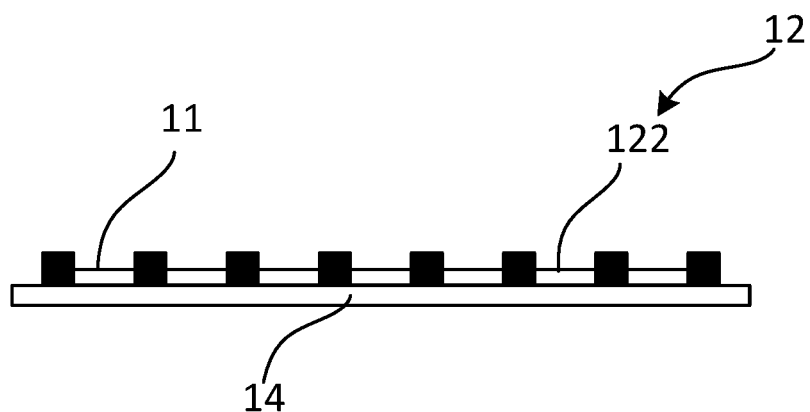
FIG. 1h is a schematic structural diagram of a sixth image sensor with an adjustable pixel density according to an example embodiment of the present application.

Alternatively, the image sensor may further comprise a flexible substrate, wherein the flexible substrate may comprise but is not limited to a flexible plastic substrate with certain flexibility. The shape of the flexible substrate may be changed as demanded. Image sensor pixels and a controllably-deformable material part may be disposed on a same side or different sides of the flexible substrate. For example, as shown in FIG. 1g, a plurality of the image sensor pixels 11 is connected to a surface of a flexible substrate 14, and a controllably-deformable material part (such as a controllably-deformable material layer 121) is connected to another surface of the flexible substrate 14. For another example, as shown in FIG. 1h, a plurality of the image sensor pixels 11 is connected to a surface of a flexible substrate 14, and a controllably-deformable material part (such as a controllably-deformable material connection sub-part 122) is connected to a corresponding image sensor pixel and located with the image sensor pixels 11 at the same surface of the flexible substrate 14. In this solution, integral pixel density distribution of an image sensor is indirectly adjusted through deformation of a controllably-deformable material part under control of an external field acting thereon, thereby achieving an adjustable pixel density of the image sensor, and in addition, the shape of the image sensor is flexibly changed by adopting a flexible substrate, for example, a planar image sensor is bent to a certain angular degree, so as to obtain a curved image sensor, thereby satisfying diversified application demands of image acquisition, decoration and the like.

Figure 1I:
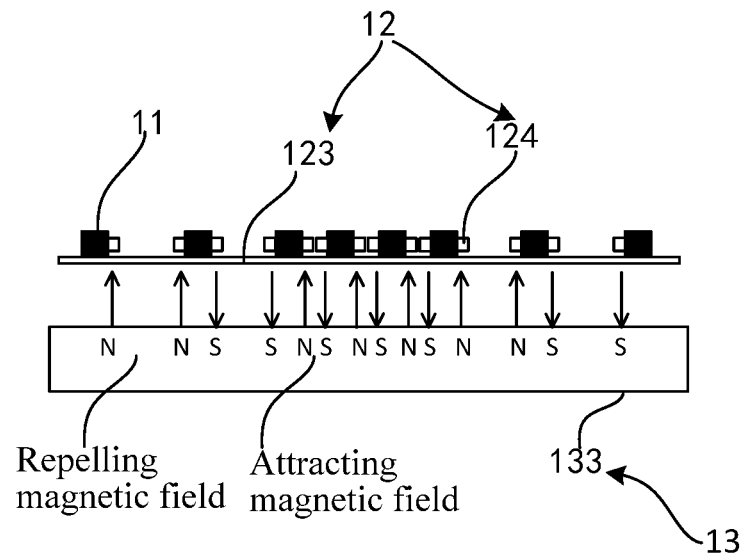
FIG. 1i is a schematic structural diagram of a seventh image sensor with an adjustable pixel density according to an example embodiment of the present application.

FIG. 1i is a schematic structural diagram of a seventh image sensor with an adjustable pixel density provided by an embodiment of the present application. In an image sensor as shown in FIG. 1i, the controllably-deformable material part 12 comprises a flexible substrate 123 and a plurality of magnetic conductive material parts 124, wherein a plurality of image sensor pixels 11 is separately connected to the flexible substrate 123, and at least a part of the image sensor pixels 11 is connected to the plurality of magnetic conductive material parts 124. The flexible substrate 123 is caused to undergo corresponding deformation by change of a magnetic field acting on the magnetic conductive material part 124, and density distribution of the plurality of image sensor pixels 11 is accordingly adjusted through the deformation. For example, a magnetic conductive material part 124 may be disposed on a side of each image sensor pixel. Alternatively, the image sensor pixel 11 is separately adhered to the flexible substrate 123 and the magnetic conductive material part 124. The magnetic conductive material part may comprise a magnetic pole made from a magnetic conductive material, wherein the magnetic conductive material may comprise but is not limited to one or more of a soft magnetic material, a silicon steel sheet, a permalloy, a ferrite, an amorphous soft magnetic alloy, a super-microcrystalline soft magnetic alloy, and the like. The magnetic conductive material part made from a soft magnetic material has a good magnetic conductivity, and after removal of a magnetic field, residual magnetism is very small, which facilitates adjustment next time.

Further, alternatively, the deformation control part 13 in this embodiment of the present application may further comprise an magnetic field control part 133, wherein the magnetic field control part 133 is configured to adjust distribution of an external magnetic field acting on the controllably-deformable material part, so as to control the controllably-deformable material part to undergo corresponding deformation. For example, when the magnetic control part 133 controls a magnetic field (namely, exciting magnetic field) acting on the magnetic conductive material part 124 to change, as shown in FIG. 1i, a repelling magnetic field induced by same magnetic poles (NN or SS) or an attracting magnetic field induced by different magnetic poles (NS or SN) with certain distribution intensity is imposed on adjacent image sensor pixels, a force of magnetic repulsion or attraction between magnetic poles will be induced accordingly. The magnetic force is transmitted to the flexible substrate 123, to cause the flexible substrate 123 to undergo deformation such as expansion or shrinkage, thereby changing an interval of corresponding image sensor pixels, and achieving a purpose of adjusting density distribution of image sensor pixels. In combination with a deformable (expandable and shrinkable, and the like) feature of a flexible substrate and the principle of magnetic field control, this solution can achieve adjustable pixel density distribution of an image sensor.

Figure 1J:
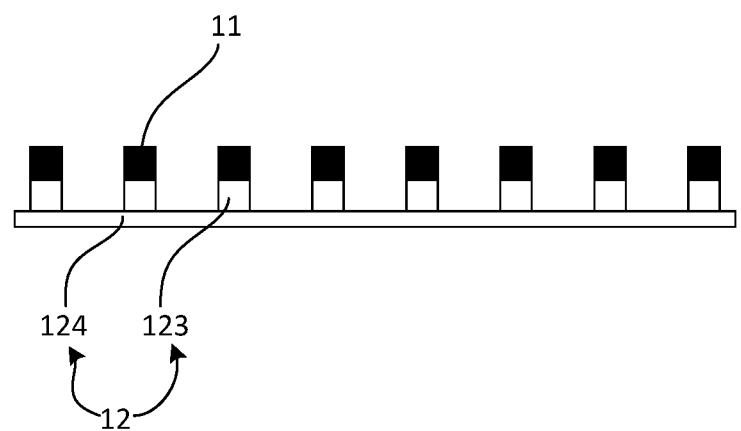
FIG. 1j is a schematic structural diagram of an eighth image sensor with an adjustable pixel density according to an example embodiment of the present application.

FIG. 1j is a schematic structural diagram of an eighth image sensor with an adjustable pixel density provided by an embodiment of the present application. In an image sensor as shown in FIG. 1j, the controllably-deformable material part 12 comprises: a flexible substrate 123 and a plurality of magnetic conductive material parts 124, wherein a surface of the plurality of magnetic conductive material parts 124 is separately connected to the flexible substrate 123, and an opposing surface of the plurality of magnetic conductive material parts 124 is separately connected to the plurality of image sensor pixels 11 correspondingly. The flexible substrate 123 is caused to undergo corresponding deformation by change of a magnetic field acting on the magnetic conductive material part 124, and density distribution of the plurality of image sensor pixels 11 is accordingly adjusted through the deformation. Alternatively, the magnetic conductive material part 124 is adhered to the flexible substrate 123, and the image sensor pixels 11 are adhered to the magnetic conductive material part 124. When a magnetic field acting on the magnetic conductive material part 124 changes, a magnetic force is transmitted to the flexible substrate 123, and causes the flexible substrate 123 to undergo deformation such as expansion or shrinkage, thereby achieving a purpose of adjusting density distribution of image sensor pixels. In combination with a deformable (expandable and shrinkable, and the like) feature of a flexible substrate and the principle of magnetic field control, this solution can achieve adjustable pixel density distribution of an image sensor.

After pixel density distribution of the image sensor is adjusted according to the target pixel density distribution information, image acquisition is performed on the image to be acquired. During a process of image acquisition, all image sensor pixels of the image sensor are involved in the image acquisition, but pixel densities of different regions may vary, to cause a part of an image on a region of the image sensor with a high pixel density to have high resolution and abundant details, and a part of an image on a region of the image sensor with a low pixel density to have low resolution and a few details. Overall size of the acquired image is equal to the size of an image acquired when the image sensor is not adjusted in pixel density distribution. In this way, different regions on a same acquired image are shown in different resolution, which facilitates improvement of image acquisition efficiency and visual display of an image.

To further reduce the pressure of image storage resources and/or transmission bandwidth resources, an image (or called an original acquired image) acquired on the basis of a technical solution provided by this embodiment of the present application can be processed with compressing to reduce the size of the image. For example, the acquired image is processed with down-sampling according to a certain down-sampling rate, so as to reduce the size of the image; and in addition, even if a part originally acquired from a region of the image sensor with a high pixel density is processed with down-sampling, resolution loss of the image is relatively less, so as to facilitate improving image display efficiency of this part and visual experience of a user.

In addition, if the original acquired image needs to be enlarged, a part of an image acquired from a region of the image sensor with a high pixel density has high resolution and abundant image details, and therefore image processing at greater magnification can be supported, that is, post-processing of an original acquired image is very convenient and flexible, which facilitates relieving the pressure of image storage and/or transmission bandwidth, and better satisfies diversified application demands of a user.

In this embodiment of the present application, after image acquisition is performed according to the image sensor with adjusted pixel density distribution, an acquired image can be scanned and output. For example, pixel index information of the image sensor can be acquired; and an acquired image is scanned and output according to the pixel index information. The pixel index information of the image sensor comprises original location information of each image sensor pixel before the image sensor is adjusted in pixel density distribution. A scanning method (line-by-line scanning, sequential sweeping, interlaced scanning, and the like) is adopted to perform image scanning and outputting according to the pixel index information. Because actual location information of a pixel of the image sensor during a process of image acquisition deviates from corresponding index information of the pixel to a certain degree, an image scanned and output according to the pixel index information is a deformed image with an abnormal display scale relative to the original acquired image. Compared with the original acquired image, the size of a part of the deformed image corresponding to a region with a high pixel density is greater than the size of that in the original acquired image. For example, under a circumstance that a head portrait part is acquired on the basis of a region with a high pixel density of the image sensor, the head portrait part in a deformed image that is obtained through scanning and outputting is greater than the head portrait part in the original acquired image. In this way, a user can more conveniently find a part needing great attention, thereby improving efficiency of image display and visual experience of the user.

If an undeformed image with a same display scale as the original acquired image needs to be obtained, a deformed image that is scanned and output can be recovered according to the target pixel density distribution information, so as to obtain a recovered image with a normal display scale corresponding to the original acquired image.

It should be understood by a person skilled in the art that, in any aforementioned method of the specific embodiments of the present application, the value of the serial number of each step does not mean an execution sequence, and the execution sequence of the steps should be determined according to the function and internal logic thereof, and should not constitute any limitation on the implementation process of the specific embodiments of the present application.

Figure 2:
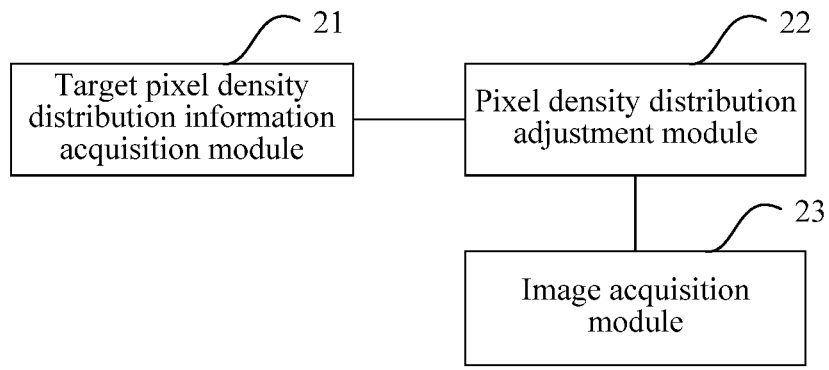
FIG. 2 is a structural block diagram of a first image acquisition control apparatus according to an example embodiment of the present application.

FIG. 2 is a structural block diagram of a first image acquisition control apparatus provided by an embodiment of the present application. As shown in FIG. 2, an image acquisition control apparatus provided by this embodiment of the present application comprises: a target pixel density distribution information acquisition module 21, a pixel density distribution adjustment module 22 and an image acquisition module 23.

The target pixel density distribution information acquisition module 21 is configured to acquire target pixel density distribution information of an image to be acquired.

The pixel density distribution adjustment module 22 is configured to adjust pixel density distribution of an image sensor according to the target pixel density distribution information.

The image acquisition module 23 is configured to acquire the image to be acquired according to the adjusted image sensor.

When the image acquisition control apparatus provided by this embodiment of the present application is adopted to perform image acquisition control, all pixels of an image sensor are involved in image acquisition. In addition, pixel density distribution of the image sensor has been adjusted according to target pixel density distribution information of an image to be acquired, and therefore, resolution of different regions of the image acquired according to the adjusted image sensor shows differentiated distribution corresponding to the target pixel density distribution information. In this solution, integral pixels of the image sensor are fully utilized to make corresponding adjustment on existing pixel density distribution of the image sensor according to the target pixel density distribution information, to achieve an effect of performing image acquisition on different regions according to different pixel densities, and cause resolution of different regions of the acquired image to vary, thereby facilitating improvement of image acquisition efficiency without increasing the size of the image, and better satisfying diversified application demands of a user.

There is no limit to the manners in which the image acquisition control apparatus is embodied. For example, the image acquisition control apparatus may be an independent component, the component cooperating with an image acquisition device comprising an image sensor in communications; or the image acquisition control apparatus may be integrated as a functional module into an image acquisition device comprising an image sensor, which is not restricted in this embodiment of the present application.

Figure 3:
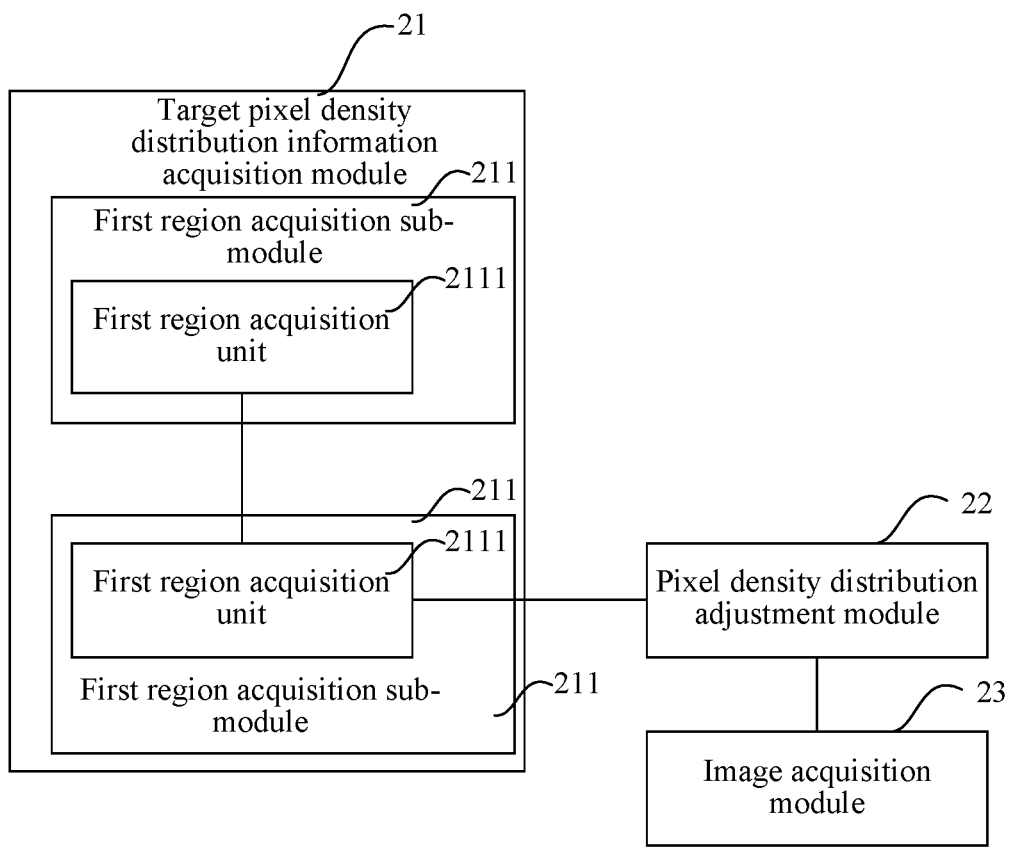
FIG. 3 is a structural block diagram of a second image acquisition control apparatus according to an example embodiment of the present application.

Alternatively, as shown in FIG. 3, the target pixel density distribution acquisition module 21 comprises: a first region acquisition sub-module 211 and a target pixel density distribution information determining sub-module 212. The first region acquisition sub-module 211 is configured to acquire a first region of the image to be acquired. The target pixel density distribution information determining sub-module 212 is configured to determine the target pixel density distribution information according to the first region, wherein a target pixel density corresponding to the first region is different from a target pixel density corresponding to a second region in the target pixel density distribution information, wherein the second region comprises at least a part of a region other than the first region in the image to be acquired. The first region may comprise at least a part of a region in the image to be acquired, for which resolution needs to be adjusted such as increased or reduced. Specifically, in the target pixel density distribution information, a target pixel density corresponding to the first region may be greater than a target pixel density corresponding to the second region; or in the target pixel density distribution information, a target pixel density corresponding to the first region may be less than a target pixel density corresponding to the second region. The above solution may be implemented in very flexible manners, thereby better satisfying diversified application demands of a user.

Alternatively, the first region acquisition sub-module 211 comprises a first region acquisition unit 2111. The first region acquisition unit 2111 is configured to acquire one or more first sub-regions of the image to be acquired, wherein the first region comprises the one or more first sub-regions.

Under a circumstance that the first region comprises a plurality of the first sub-regions, the plurality of the first sub-regions may be continuously or discretely distributed in the image to be acquired, thereby improving flexibility of determining of the first region.

Alternatively, the target pixel density distribution information determining sub-module 212 comprises a first target pixel density distribution information determining unit 2121. The first target pixel density distribution information determining unit 2121 is configured to determine the target pixel density distribution information according to one or more of the first sub-regions. Under a circumstance that there is a plurality of first sub-regions, in the target pixel density distribution information, a target pixel density corresponding to at least one of the first sub-regions is different from a target pixel density corresponding to any one of the other first sub-regions. In this solution, resolution of a plurality of first sub-regions in the image to be acquired can be adjusted to a same degree, to cause the resolution of the plurality of first sub-regions to be identical or as close as possible. Or, under a circumstance that there is a plurality of first sub-regions, in the target pixel density distribution information, target pixel densities respectively corresponding to the plurality of sub-regions are identical. In this solution, resolution of a plurality of first sub-regions in the image to be acquired can be adjusted to a different degree, to cause the resolution of the plurality of first sub-regions to show a certain degree of differentiation.

Figure 4:
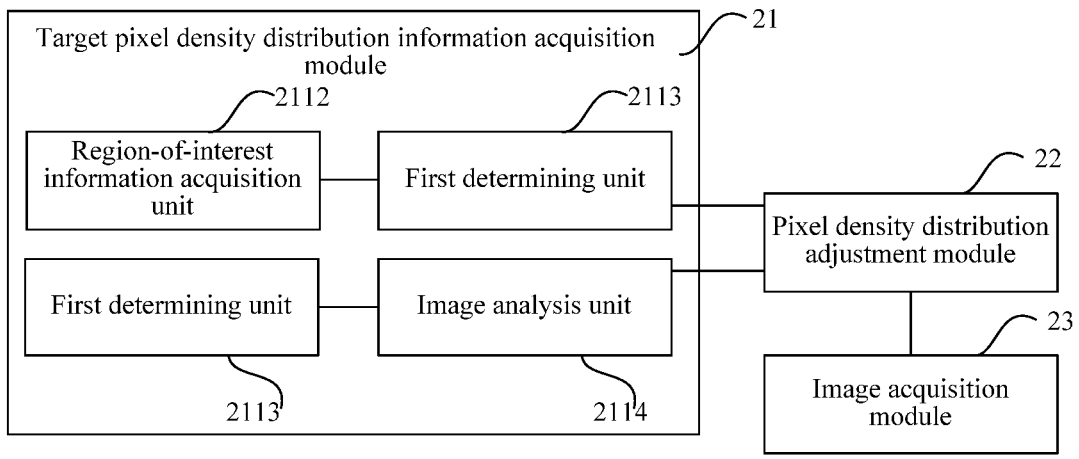
FIG. 4 is a structural block diagram of a third image acquisition control apparatus according to an example embodiment of the present application.

Alternatively, as shown in FIG. 4, the first region acquisition sub-module 211 comprises: a region-of-interest information acquisition unit 2112 and a first determining unit 2113. The region-of-interest information acquisition unit 2112 is configured to acquire information of a region of interest. The first determining unit 2113 is configured to determine the first region of the image to be acquired according to the information of the region of interest. In this solution, a first region of the image to be acquired is determined according to the region of interest, wherein the determined first region may be a region that corresponds to the region of interest, or a region of the image to be acquired that corresponds to a region of no interest, to cause determining of the first region to be more consistent with a user's actual demands, and better satisfy personalized application demands of a user.

Alternatively, the first region acquisition sub-module 211 comprises: an image analysis unit 2114 and a second determining unit 2115. The image analysis unit 2114 is configured to perform image analysis on the image to be acquired. The second determining unit 2115 is configured to determine the first region of the image to be acquired according to a result of the image analysis. In this solution, the first region can be determined according to a result of image analysis on the image to be acquired, to cause determining of the first region to be more intelligent, and improve efficiency and general applicability of the first region determining.

Figure 5:
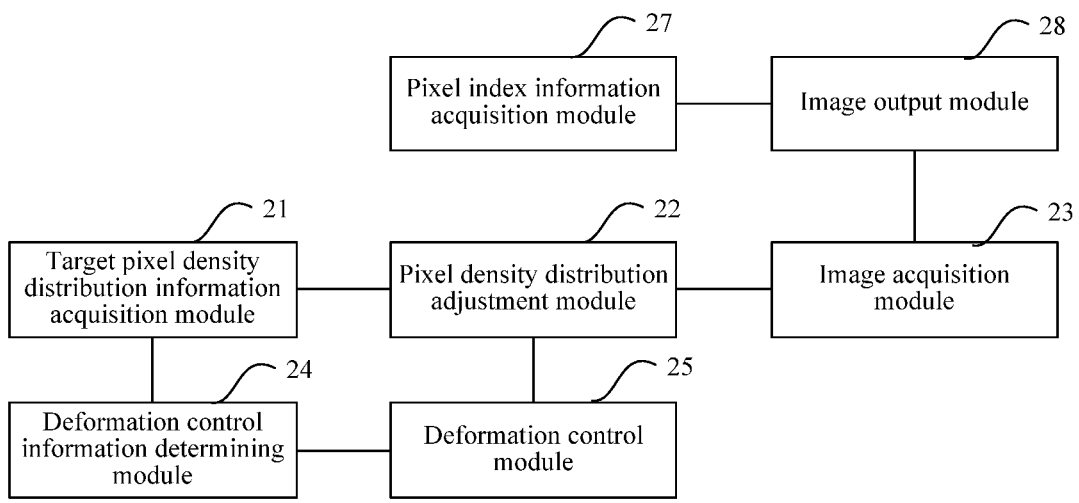
FIG. 5 is a structural block diagram of a fourth image acquisition control apparatus according to an example embodiment of the present application.

Alternatively, as shown in FIG. 5, the image acquisition control module further comprises: a deformation control information determining module 24 and a deformation control module 25. The deformation control information determining module 24 is configured to determine deformation control information of a controllably-deformable material part according to the target pixel density distribution information. The deformation control module 25 is configured to control the controllably-deformable material part to deform according to the deformation control information, so as to accordingly adjust pixel density distribution of the image sensor through deformation of the controllably-deformable material part. The controllably-deformable material part is made from at least one or more of the following controllably-deformable materials: a piezoelectric material, an electroactive polymer, and a photodeformable material. This solution can fully utilize a unique a physical property of a controllably-deformable material (for example, a piezoelectric material may undergo mechanical deformation under the effect of an electric field, an electroactive polymer may exhibit a change in shape and/or size under the effect of an electric field, and the photodeformable material may deform under the effect of an optical field, and the like), so as to achieve a purpose of indirectly adjusting pixel distribution of the image sensor.

Alternatively, the image acquisition control apparatus further comprises: a pixel index information acquisition module 27 and an image output module 28. The pixel index information acquisition module 27 is configured to acquire pixel index information of the image sensor. The image output module 28 is configured to scan and output the acquired image according to the pixel index information. In this solution, an image scanned and output according to the pixel index information is a deformed image with an abnormal display scale relative to an original acquired image. Compared with the original acquired image, the size of a part of the deformed image corresponding to a region with a high pixel density is greater than the size of that in the original acquired image. In this way, a user can conveniently find a part needing great attention, thereby improving efficiency of image display and visual experience of the user.

Figure 6:
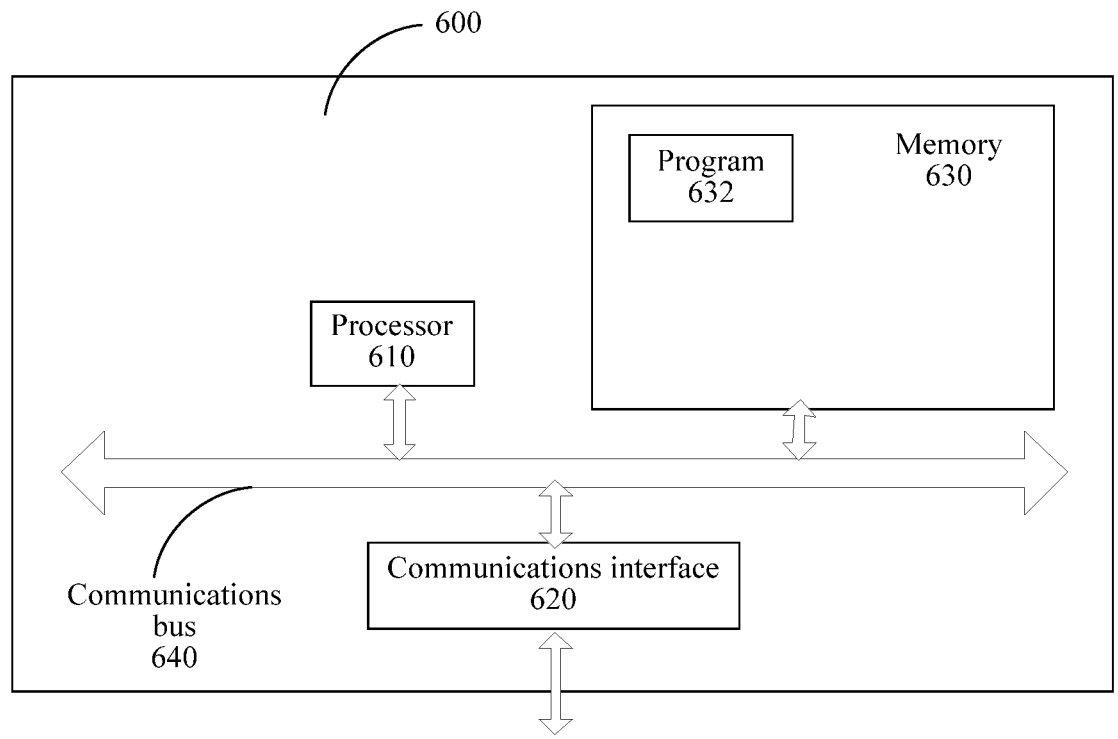
FIG. 6 is a structural block diagram of a fifth image acquisition control apparatus according to an example embodiment of the present application.

FIG. 6 is a structural block diagram of a fifth image acquisition control apparatus provided by an embodiment of the present application. The example embodiment of the image acquisition control apparatus 600 is not restricted in specific embodiments of the present application. As shown in FIG. 6, the image acquisition control apparatus 600 may comprise:

a processor 610, a communications interface 620, a memory 630, and a communications bus 640, wherein:

the processor 610, the communications interface 620, and the memory 630 communicate with each other by using the communications bus 640;

the communications interface 620 is configured to communication with, for example, a device having a function of communications, and an external optical source; and the processor 610 is configured to execute a program 632, and specifically, can perform relevant steps in any one of the foregoing embodiments of an image acquisition control method.

For example, the program 632 may comprise program code, wherein the program code comprises computer operation instructions.

The processor 610 may be a central processing unit (CPU for short), an application specific integrated circuit (ASIC for short), or one or more integrated circuits configured to implement the embodiments of the present application.

The memory 630 is configured to store the program 632. The memory 630 may comprise a random access memory (RAM for short), and may also comprise a non-volatile memory, for example, at least one magnetic disk memory.

For example, in an alternative example embodiment, the processor 610 can perform the following steps by means of executing the program 632: acquiring target pixel density distribution information of an image to be acquired; adjusting pixel density distribution of an image sensor according to the target pixel density distribution information; and acquiring the image to be acquired according to the adjusted image sensor.

In another alternative example embodiment, the processor 610 can also perform steps mentioned in any one of the other embodiments described as above, and the details are not described herein again.

For specific implementation of the steps in the program 632, refer to the description of corresponding steps, modules, sub-modules and units in the foregoing embodiments. The details are not described herein again. A person skilled in the art may clearly understand that, for the purpose of convenient and brief description, the description of corresponding processes in the foregoing method embodiments may be referred to for the specific operation process of the above devices and modules. The details are not described herein again.

Figure 7:
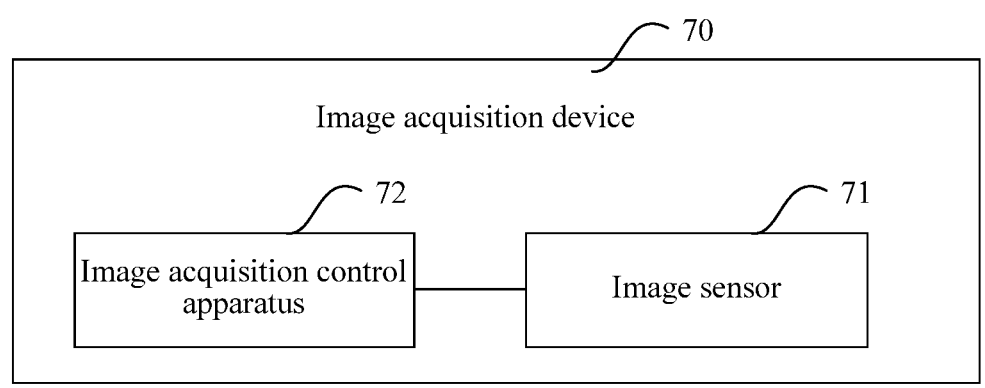
FIG. 7 is a structural block diagram of an image acquisition device according to an example embodiment of the present application.

FIG. 7 is a structural block diagram of an image acquisition device provided by an embodiment of the present application. As shown in FIG. 7, an image acquisition device 70 provided by this embodiment of the present application comprises an image sensor 71 and an image acquisition control apparatus 72, the image acquisition control apparatus 72 being connected to the image sensor 71. For the structure and work principle of the image acquisition control apparatus, refer to the foregoing description of corresponding embodiments, and the details are not described herein again. The image sensor comprises a flexible substrate and a plurality of image sensor pixels formed on the flexible substrate. The image acquisition device may comprise but is not limited to a device having a function of image acquisition such as photo taking, camera shooting, photographing, and video monitoring. For example, the image acquisition device may be but is not limited to one of the following devices: a camera, a mobile phone, a webcam, a video camera, and a video cassette recorder.

According to the technical solution provided by this embodiment of the present application, target pixel distribution information of an image to be acquired is acquired by using an image acquisition control apparatus; pixel density distribution of an image sensor is then adjusted according to the acquired target pixel distribution information of the image to be acquired; and the image to be acquired is acquired according to the adjusted image sensor, to cause integral pixels of the image sensor to be fully utilized during a process of image acquisition, and achieve differentiated resolution of different displayed regions of the acquired image, thereby facilitating improvement of image acquisition efficiency without increasing the size of the image, and better satisfying diversified application demands of a user.

Alternatively, the image sensor comprises: a plurality of image sensor pixels distributed in an array form, and a controllably-deformable material part separately connected to the plurality of image sensor pixels, wherein the controllably-deformable material part may undergo deformation under the effect of an external field, and density distribution of the plurality of image sensor pixels is accordingly adjusted through the deformation; and the external field is controlled by the image acquisition control apparatus.

For the structure of the image sensor, refer to corresponding records in FIG. 1b to FIG. 1j. The image acquisition control apparatus can directly control the external field so as to control deformation of the controllably-deformable material part, thereby adjusting pixel density distribution of the image sensor; or the image acquisition control apparatus can indirectly control the external field by controlling the deformation control part, to cause the controllably-deformable material part to undergo corresponding deformation, thereby accordingly adjusting pixel density distribution of the image sensor; and so forth. The physical connection manner of the image sensor pixels and the controllably-deformable material part may be determined according to actual demands, which is not restricted in this embodiment of the present application on the condition that pixel density distribution of the image sensor can be adjusted when the controllably-deformable material part undergoes deformation. For the example embodiments, refer to the aforementioned corresponding records, and the details are not described herein again.

In the foregoing embodiments of the present application, the serial number and/or sequence of the embodiments are only used for the convenience of description, and do not represent inferiority or superiority of embodiments. The description of each embodiment has a different focus. For any part of an embodiment not described in details, refer to relevant description of another embodiment. For relevant description of the implementation principle or process of apparatus, device or system embodiments, refer to records of relevant method embodiments, and the details are not described herein again.

A person of ordinary skill in the art may recognize that, the units, methods and procedures of each example described with reference to the embodiments disclosed herein, can be implemented by electronic hardware or a combination of computer software and electronic hardware. Whether the functions are performed by means of hardware or software depends on particular applications and design constraint conditions of the technical solutions. A person skilled in the art may use different methods to implement the described functions for each particular application, but the implementation should not be considered to go beyond the scope of the present application.

When the functions are implemented in the form of a software functional unit and sold or used as an independent product, the functions may be stored in a computer-readable storage medium. Based on such an understanding, the technical solutions of the present application essentially, or a part thereof contributing to the existing art, or a part of the technical solutions may be implemented in the form of a software product. The computer software product is stored in a storage medium and comprises several instructions for instructing a computer device (such as a personal computer, a server, or a network device) to perform all or a part of the steps of the methods in the embodiments of the present application. The foregoing storage medium comprises: any medium that can store program code, such as a USB flash drive, a removable hard disk, a read-only memory (ROM for short), a random access memory (RAM for short), a magnetic disk, or an optical disc.

In the apparatus, method and system embodiments of the present application, apparently, each component (such as a system, a sub-system, a module, a sub-module, a unit, and a sub-unit) or step may be decomposed, combined and/or recombined after decomposition. Such decomposition and/or recombination shall be considered as an equivalent solution of the present application. In addition, in the above description of the specific embodiments of the present application, a feature described and/or shown for one example embodiment may be used in one or more of other example embodiments in a same or similar manner, or combined with a feature in another example embodiment, or replace a feature in another example embodiment.

It should be emphasized that, the term "comprise" used herein refers to existence of a feature, an element, a step or an assembly, but does not exclude existence or addition of one or more of other features, elements, steps or assemblies.

Finally, it should be noted that, the above example embodiments are only used to describe the present application, rather than limit the present application. Various changes and modifications may be made by a person of ordinary skill in the art without departing from the spirit and scope of the present application. Therefore, all equivalent technical solutions also belong to the scope of the present application, and the patent protection scope of the present application should be defined by the claims.

What is claimed is:

1. A method, comprising:
acquiring, by a system comprising a processor, target pixel density distribution information of an image to be acquired, wherein the target pixel density distribution information represents a relative expectation of a user or device for image resolution of different regions of the image to be acquired;
adjusting pixel density distribution of an image sensor according to the target pixel density distribution information resulting in an adjusted image sensor, wherein the adjusting pixel density distribution of the image sensor according to the target pixel density distribution information comprises:
determining deformation control information of a controllably-deformable material part according to the target pixel density distribution information; and
controlling the controllably-deformable material part to deform according to the deformation control information, to accordingly adjust the pixel density distribution of the image sensor through deformation of the controllably-deformable material part; and
acquiring the image to be acquired according to the adjusted image sensor.

2. The method of claim 1, wherein the acquiring the target pixel density distribution information of the image to be acquired comprises:
acquiring a first region of the image to be acquired; and
determining the target pixel density distribution information according to the first region, wherein a target pixel density corresponding to the first region is different from another target pixel density corresponding to a second region in the target pixel density distribution information, and wherein the second region comprises at least a part of a region other than the first region in the image to be acquired.

3. The method of claim 2, wherein the first region comprises one or more first sub-regions.

4. The method of claim 3, wherein respective target pixel densities corresponding to one or more second sub-regions that are different from the one or more first sub-regions are identical in the target pixel density distribution information.

5. The method of claim 3, wherein a first target pixel density corresponding to at least one of the one or more first sub-regions is different from a second target pixel density corresponding to any one of the one or more second sub-regions in the target pixel density distribution information.

6. The method of claim 2, wherein a first target pixel density corresponding to the first region is greater than a second target pixel density corresponding to the second region in the target pixel density distribution information.

7. The method of claim 2, wherein a first target pixel density corresponding to the first region is less than a second target pixel density corresponding to the second region in the target pixel density distribution information.

8. The method of claim 2, wherein the acquiring the first region of the image to be acquired comprises:
acquiring information of a region of interest; and
determining the first region of the image to be acquired according to the information of the region of interest.

9. The method of claim 2, wherein the acquiring the first region of the image to be acquired comprises:
performing image analysis on the image to be acquired; and
determining the first region of the image to be acquired according to a result of the image analysis.

10. The method of claim 1, wherein the controllably-deformable material part is made from at least one of a piezoelectric material, an electroactive polymer, a photodeformable material, or a magnetostrictive material.

11. The method of claim 1, further comprising:
acquiring pixel index information of the image sensor; and
scanning and outputting the acquired image according to the pixel index information.

12. An apparatus, comprising:
a memory that stores executable modules; and
a processor, couple to the memory, that executes or facilitates execution of the executable modules, the executable modules comprising:
a target pixel density distribution information acquisition module configured to acquire target pixel density distribution information of an image to be acquired, wherein the target pixel density distribution information represents a relative expectation of a user or device for image resolution of different regions of the image to be acquired;
a pixel density distribution adjustment module configured to adjust pixel density distribution of an image sensor according to the target pixel density distribution information, wherein the pixel density distribution adjustment module comprises:
a deformation control information determining module configured to determine deformation control information of a controllably-deformable material part according to the target pixel density distribution information; and
a deformation control module configured to control the controllably-deformable material part to deform according to the deformation control information, to accordingly adjust the pixel density distribution of the image sensor through deformation of the controllably-deformable material part; and
an image acquisition module configured to acquire the image to be acquired according to the image sensor as adjusted.

13. The apparatus of claim 12, wherein the target pixel density distribution information acquisition module comprises:
a first region acquisition sub-module configured to acquire a first region of the image to be acquired; and
a target pixel density distribution information determining sub-module configured to determine the target pixel density distribution information according to the first region, wherein a first target pixel density corresponding to the first region is different from a second target pixel density corresponding to a second region in the target pixel density distribution information, and wherein the second region comprises at least a part of a region other than the first region in the image to be acquired.

14. The apparatus of claim 13, wherein the first region acquisition sub-module comprises:

a first region acquisition unit configured to acquire one or more first sub-regions of the image to be acquired, and wherein the first region comprises the one or more first sub-regions.

15. The apparatus of claim 14, wherein the target pixel density distribution information determining sub-module comprises:
a first target pixel density distribution information determining unit configured to determine the target pixel density distribution information according to the one or more first sub-regions, wherein when the one or more first sub-regions are present in the target pixel density distribution information, a first target pixel density corresponding to at least one of the one or more first sub-regions is different from at least one of a second target pixel density corresponding to any one of one or more second sub-regions, or a third target pixel density comprising every target pixel density corresponding to a sub-region of the one or more first sub-regions, are identical.

16. The apparatus of claim 13, wherein the first region acquisition sub-module comprises:
a region-of-interest information acquisition unit configured to acquire information of a region of interest; and
a first determining unit configured to determine the first region of the image to be acquired according to the information of the region of interest.

17. The apparatus of claim 13, wherein the first region acquisition sub-module comprises:
an image analysis unit configured to perform image analysis on the image to be acquired; and
a second determining unit configured to determine the first region of the image to be acquired according to a result of the image analysis.

18. The apparatus of claim 12, wherein the executable modules further comprise:
a pixel index information acquisition module configured to acquire pixel index information of the image sensor; and
an image output module configured to scan and output the image to be acquired according to the pixel index information.

19. A device, comprising:
an image sensor; and
an apparatus, comprising:
a target pixel density distribution information acquisition component configured to acquire target pixel density distribution information of an image to be acquired, wherein the target pixel density distribution information represents a relative expectation of a user or device for image resolution of different regions of the image to be acquired;
a pixel density distribution adjustment component configured to adjust pixel density distribution of an image sensor according to the target pixel density distribution information; and
an image acquisition component configured to acquire the image to be acquired according to the image sensor as adjusted,
wherein the apparatus is connected to the image sensor, and
wherein the image sensor comprises:
a plurality of image sensor pixels that are distributed in an array form; and
a controllably-deformable material part, being connected to the plurality of image sensor pixels separately, wherein the controllably-deformable material part is deformable under an effect of an external field, and a density distribution of the plurality of image sensor pixels is accordingly adjusted through the deformation, and wherein the external field is controlled by the apparatus.

20. A computer readable storage apparatus, comprising at least one executable instruction, which, in response to execution, causes an apparatus comprising a processor to perform operations, comprising:
acquiring target pixel density distribution information of an image to be acquired, wherein the target pixel density distribution information represents a relative expectation of a user or device for image resolution of different regions of the image to be acquired;
adjusting pixel density distribution of an image sensor according to the target pixel density distribution information, wherein, the adjusting pixel density distribution of the image sensor according to the target pixel density distribution information comprises:
determining deformation control information of a controllably-deformable material part according to the target pixel density distribution information; and
controlling the controllably-deformable material part to deform according to the deformation control information, to accordingly adjust the pixel density distribution of the image sensor through deformation of the controllably-deformable material part; and
acquiring the image to be acquired according to the image sensor as adjusted.

21. An image acquisition control apparatus, comprising a processor and a memory, wherein the memory stores computer executable instructions, the processor is connected to the memory via a communication bus, and, when the image acquisition control apparatus for controlling task migration operates, the processor executes or facilitates execution of the computer executable instructions stored in the memory, so that the image acquisition control apparatus executes operations, comprising:
acquiring target pixel density distribution information of an image to be acquired, wherein the target pixel density distribution information represents a relative expectation of a user or device for image resolution of different regions of the image to be acquired;
modifying a pixel density distribution of an image sensor according to the target pixel density distribution information resulting in a modified image sensor, wherein, the modifying a pixel density distribution of an image sensor according to the target pixel density distribution information comprises:
determining deformation control information of a controllably-deformable material part according to the target pixel density distribution information; and
controlling the controllably-deformable material part to deform according to the deformation control information, to accordingly adjust the pixel density distribution of the image sensor through deformation of the controllably-deformable material part; and
acquiring the image to be acquired according to the modified image sensor.

22. The image acquisition control apparatus of claim 21, wherein the acquiring the target pixel density distribution information of the image to be acquired comprises:
acquiring a first region of the image to be acquired; and
determining the target pixel density distribution information according to the first region, wherein a target pixel density corresponding to the first region is different from another target pixel density corresponding to a second region in the target pixel density distribution information, and wherein the second region comprises at least a part of a region other than the first region in the image to be acquired.

23. The image acquisition control apparatus of claim 22, wherein the first region comprises one or more first sub-regions.

24. The image acquisition control apparatus of claim 23, wherein respective target pixel densities corresponding to one or more second sub-regions that are different from the one or more first sub-regions, are identical in the target pixel density distribution information.

* * * * *